United States Patent
Matsui et al.

(10) Patent No.: US 6,753,524 B2
(45) Date of Patent: Jun. 22, 2004

(54) INSPECTION SYSTEM AND INSPECTION PROCESS FOR WAFER WITH CIRCUIT USING CHARGED-PARTICLE BEAM

(75) Inventors: Miyako Matsui, Kokubunji (JP); Mari Nozoe, Hino (JP)

(73) Assignee: Hitachi, Ltd., Tokyo (JP)

( * ) Notice: Subject to any disclaimer, the term of this patent is extended or adjusted under 35 U.S.C. 154(b) by 36 days.

(21) Appl. No.: 10/166,774

(22) Filed: Jun. 12, 2002

(65) Prior Publication Data

US 2003/0094572 A1 May 22, 2003

(30) Foreign Application Priority Data

Nov. 19, 2001 (JP) ........................................ 2001-352539

(51) Int. Cl.[7] .............................................. G01B 11/00
(52) U.S. Cl. ..................... 250/310; 250/311; 250/548; 250/561; 250/571; 324/751; 324/752; 356/394; 356/237.1; 356/237.5
(58) Field of Search ................................ 250/310, 311, 250/548; 324/751; 356/394, 237.1

(56) References Cited

U.S. PATENT DOCUMENTS

| 6,232,787 | B1 | * | 5/2001 | Lo et al. | 324/751 |
| 6,388,747 | B2 | * | 5/2002 | Nara et al. | 356/394 |
| 6,559,663 | B2 | * | 5/2003 | Shinada et al. | 324/751 |

FOREIGN PATENT DOCUMENTS

| JP | 11-087451 | 9/1997 |
| JP | 11-121561 | 7/1998 |

OTHER PUBLICATIONS

Nara et al. "Inspection Method, Apparatus and System for Circuit Pattern", Pub. No: US 2003/0058444 A1, publication date: Mar. 27, 2003.*

* cited by examiner

Primary Examiner—John R. Lee
Assistant Examiner—Zia R. Hashmi
(74) Attorney, Agent, or Firm—Reed Smith LLP; Stanley P. Fisher, Esq.; Juan Carlos A. Marquez, Esq.

(57) ABSTRACT

In a method for inspecting positions and types of defects on wafers with circuit patterns in a semiconductor manufacturing process, inspection is made regardless of the types and materials of junctions of circuit patterns of the semiconductor devices, different kinds of defects being distinguished from one another. Further, electrification of the circuit pattern is prevented, and the area to be exposed to an electron beam is controlled evenly and at a desired voltage. During inspection of the positions and types of defects on a wafer using a charged-particle beam from a charged-particle source, an optical beam from an optical source as well as a charged-particle beam are applied to a junction of the circuit pattern of the wafer placed on a wafer holder. Thus, regardless of the types and materials of circuit patterns, a highly sensitive inspection is made according to contrasts in the defects of a captured image.

21 Claims, 10 Drawing Sheets

INSPECTION SYSTEM AND INSPECTION PROCESS FOR WAFER WITH CIRCUIT USING CHARGED-PARTICLE BEAM

BACKGROUND OF THE INVENTION

1. Field of the Invention

The present invention relates generally to technology for inspecting a wafer with a circuit using a charged-particle beam such as an electron beam and more particularly to technology for detecting foreign bodies and defects on the substrates of wafers with minute circuit patterns.

2. Description of Related Art

With the ever heightening integration of integrated circuits, the number of wiring layers of each integrated circuit is increasing and its wiring pattern is becoming more complex. At the same time, the dielectric constants of materials of insulators are being reduced and the materials of insulators are being diversified. Hoped for under the circumstances is technology for inspecting integrated circuits for electric defects speedily, stably in their manufacturing processes. It is necessary for the production of system LSI's and the like to develop many circuit-forming processes in a short time period, which requires technology for inspecting many kinds of circuits. Available at present is technology to detect electric defects of wafers in their manufacturing processes by applying a charged-particle beam to each inspection area on the surface of a wafer and finding defects by, or based on, their distinctive contrasts in a secondary-electron image of the inspection area, the distinctive contrasts caused by the changed electric potential of the defects.

Japanese Patent Laid-Open No. 121561/1999 discloses a process for detecting discontinuity of contact holes containing transistors such as CMOS's. According to the method, contact holes opened on n-type diffusion layers are inspected by electrifying the surface of the wafer negatively and contact holes opened on p-type diffusion layers are inspected by electrifying the surface of the wafer positively. When contact holes opened on n-type diffusion layers are inspected, the surfaces of non-defective contact holes are not electrified negatively, but the surfaces of defective ones are electrified negatively; accordingly, defective contact holes can be distinguished from non-defective ones based on their differential contrasts in a secondary-electron image of the inspection area. When contact holes opened on p-type diffusion layers are inspected, the surfaces of non-defective contact holes are not electrified positively, but the surfaces of defective ones are electrified positively; accordingly, the defective contact holes can be distinguished from the non-defective ones based on their differential contrasts in a secondary-electron image of the inspection area. Japanese Patent Laid-Open No. 87451/1999 discloses an inspection method. According to the method, while a charged-particle beam is applied to a wafer to feed it with an electric charge, a laser beam is applied to the wafer to generate carriers at p-n junctions. The currents induced by the laser beam are taken out from the substrate and measured to detect defective contacts. Thus, this method makes possible non-contact supply of currents at any spots; accordingly, it is unnecessary to form pads for electrodes on integrated circuits and integrated circuits can be inspected and analyzed with OBIC in their manufacturing processes.

Conventional methods of inspecting integrated circuits by using an electron beam have the following problems. To detect the discontinuity of a circuit pattern including contacts with various types of junctions such as CMOS's, it is necessary to electrify the surface of each wafer positively for inspection and then electrify the surface of the wafer negatively for inspection; i.e., each wafer requires inspection twice. When the surface of a wafer shown in FIG. 2, for example, is electrified negatively for inspection, contact holes 38 opened on n-type diffusion layers 40 are electrified negatively, whereas non-defective contact holes 38 opened on the n-type diffusion layers 40 are not. When the surface of the wafer is electrified positively for inspection, defective contact holes 39 opened on p-type diffusion layers 41 are electrified positively, whereas non-defective contact holes 39 opened on the p-type diffusion layers 41 are not. In this way, each wafer, having a number of inspection areas, has to be inspected by electrifying it positively and negatively alternately. Thus, such inspection takes a considerable time, such electrification is liable to be uneven, and the sensitivity of such inspection is liable to be low. If the resistance of junctions of, for example, n-type diffusion layers of the wafer of FIG. 2 is uneven, the contact holes 38 opened on the n-type diffusion layers are electrified unevenly when the surface of the wafer is electrified positively; accordingly, some non-defective contact holes may be detected as defective based on their differential contrasts in a secondary-electron image.

In the case of the process for inspecting wafers by applying a laser beam and a charged-particle beam simultaneously and measuring the currents of the substrate, the laser beam produces electron-hole pairs, generating noises in the currents of the substrate; accordingly, it is difficult to detect differences in the faint OBIC currents. Besides, in the case of the process for measuring the currents of the substrate by applying a laser beam to generate carriers, the spatial resolution of inspection is limited by that of the laser beam applied; accordingly, it is difficult to inspect minute circuit patterns. Moreover, because dope layers are usually formed below p-n junctions under contacts, OBIC currents are influenced by the junctions between the dope layers and, hence, the sensitivity of inspection is liable to be low. Furthermore, if the circuit patterns and the Si substrate of an integrated circuit are insulated from each other by an insulator, the integrated circuit cannot be inspected by the inspection process.

SUMMARY OF THE INVENTION

Accordingly, it is an object of the present invention to provide a process for controlling the electrification of (i) the surfaces of wafers with various circuit patterns and (ii) the circuit patterns speedily, stably and inspecting the wafers for defects speedily, accurately. It is another object of the invention to provide technology for contributing toward the optimization of the manufacturing processes of integrated circuits based on data on their defects. It is yet another object of the invention to provide technology for contributing toward improving the reliability of integrated circuits by founding trouble early in their manufacturing processes and taking measures.

First of all, a process for inspecting circuit patterns including contacts with various types of junctions such as CMOS's for defects of discontinuity will be described. According to conventional methods, each wafer with a circuit is electrified positively and negatively alternately for inspection, taking a considerable time, uneven electrification being liable to occur, the sensitivity of inspection being liable to be low. In order to solve such problems, this invention provides a means for (i) capturing a secondary-electron image of an inspection area of a wafer by applying an optical beam to the front surface of a wafer while an electron beam is being applied to the front surface and (ii) thereby reducing the influence of junctions upon the contrasts of objects being inspected in the image. With this means, a wafer can be inspected by a single inspection. An optical beam to be applied to wafers for inspection is of wavelength such that the optical beam penetrates the insulators of circuit patterns, but does not penetrate junctions of silicon. If insulators formed on circuit patterns are of $SiO_2$ and $Si_3N_4$, an optical beam of wavelength of 200 nm or longer is used. The optical beam penetrates $SiO_2$ and $Si_3N_4$ on the circuit patterns and is absorbed by the Si substrate to produce electron-hole pairs. Because the optical beam does not penetrates plugs on junctions, a means is provided for applying an optical beam at a slight angle from each straight line in which plugs are arranged as shown in FIG. 9 in order for the optical beam to reach the junctions.

To avoid inspecting a wafer with a circuit twice, this invention provides another means for (i) capturing a secondary-electron image of an inspection area of a wafer by applying an optical beam to the back surface of a wafer while an electron beam is being applied to the front surface of the wafer and (ii) thereby reducing the influence of junctions upon the contrasts of objects being inspected in the image. An optical beam to be used is of wavelength of 900 to 1,200 nm so that the optical beam can penetrate the Si substrate of the wafer and produce electron-hole pairs at junctions of the wafer.

Thus, by applying an ultraviolet ray or a laser beam described above to a wafer with a circuit while an electron beam is applied to the wafer, electron-hole pairs are generated at junctions of the wafer. As a result, the differences in electrification among the surfaces of plugs due to different types of junctions are eliminated; accordingly, the wafer can be inspected for defects of discontinuity by a single inspection.

According to the present invention, a wafer with a circuit is inspected for defects by detecting secondary electrons emitted from the surface of the wafer; therefore, unlike the conventional process for inspecting a wafer by detecting the currents of its substrate, a wafer with a circuit can be inspected without noises which may otherwise occur due to carriers produced by the application of a laser beam. Besides, because the spatial resolution in the inspection methods of this invention depends on the spatial resolution of secondary electrons, the methods are capable of inspecting minuter circuit patterns than the process of the prior art.

Conventional methods of inspecting wafers with an image of secondary electrons fail to detect the open contact failure of a wafer with a hole pattern formed on an insulator of $Si_3N_4$ or the like because applying a charged-particle beam to the pattern does not produce contrasts in electric potential with respect to the insulator surrounding holes. The present invention provides a means for capturing a secondary-electron image while a surface of at least one of insulators of different materials forming the circuit pattern in the inspection area is made conductive. In an example of the means, while an electron beam is applied to a wafer with a circuit, an ultraviolet ray is applied to the surface of the wafer so as to make the surface conductive. To inspect a hole pattern where the bottoms of holes are of $Si_3N_4$ and the peripheries of holes are of $SiO_2$, an ultraviolet ray of wavelength of 150 to 200 nm is applied to the pattern so that the ultraviolet ray can penetrate the $SiO_2$ and make the bottoms of hole conductive. The ultraviolet ray is introduced into the inspection chamber through an optical fiber or the like. In the case of a wafer with a circuit pattern of high aspect ratio, the ultraviolet ray is applied to the surface of the wafer at a small angle of incidence.

Conventional methods of inspecting a wafer with secondary-electron images of inspection areas of the wafer fail to distinguish the types of discontinuity from one another; for example, fail to distinguish open contact failure caused by a residue at the bottom of a hole from disconnection due to a void in a wiring part. The present invention provides a means for capturing a secondary-electron image by applying an optical beam to a wafer with a circuit from its front or back while an electron beam is applied to the wafer. Besides, the present invention provides a mechanism to distinguish the types of defects by comparing a secondary-electron image captured without the application of a laser beam and one captured with the application of a laser beam. When a laser beam is applied to a wafer with a circuit from its back, a laser beam of wavelength of 1.2 um or longer is used. When such a laser beam is applied to a defect, the resistance of the defect changes due to thermoelectric effect; accordingly, the degree of electrification differs from defect type to defect type, the contrasts of defects in a secondary-electron image varying among defect types. The types of defects can be distinguished from one another by comparing secondary-electron images with and without the application of a laser beam.

DESCRIPTION OF THE PREFERRED EMBODIMENTS

Referring to drawings, embodiments of the present invention will now be described.

(First Embodiment)

Figure 1:
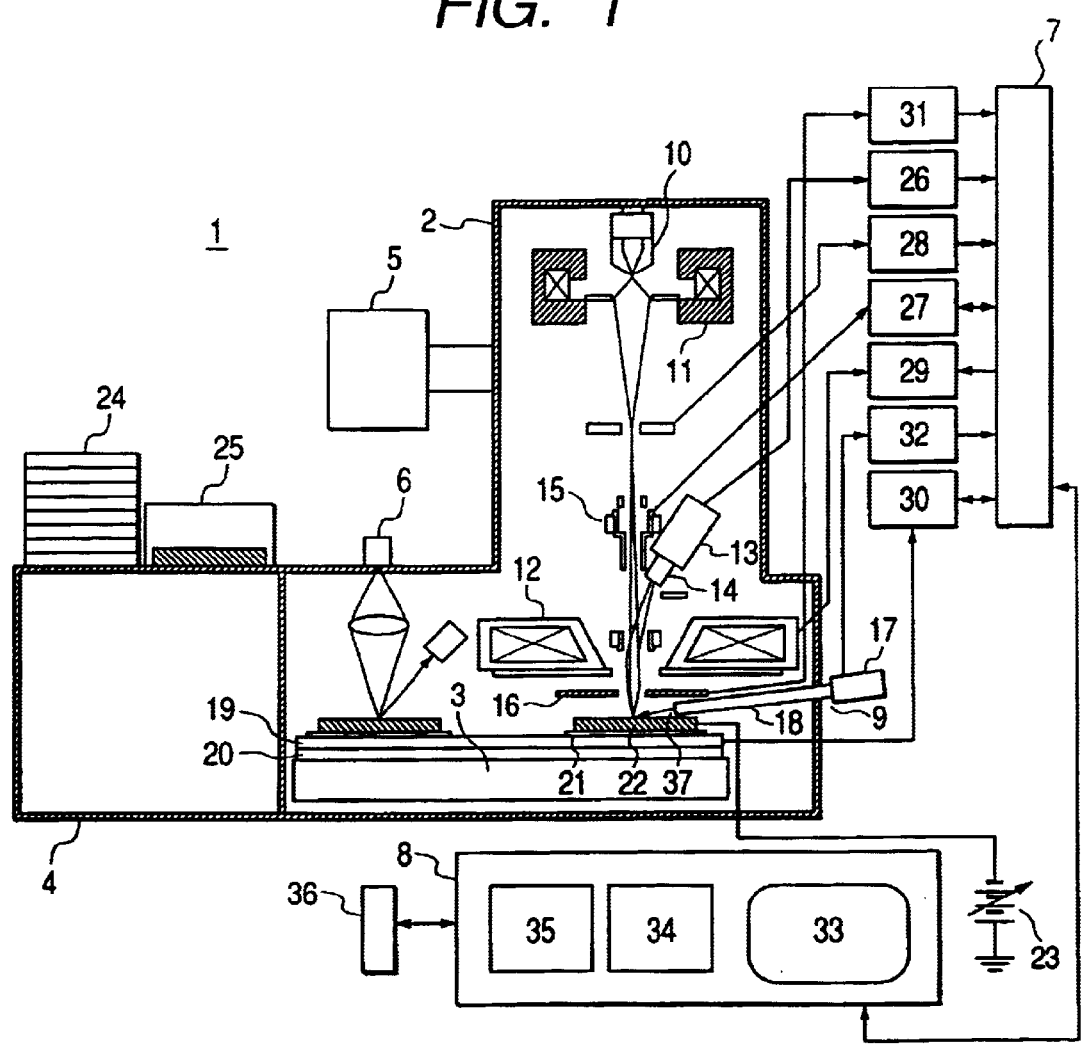
FIG. 1 is a block diagram showing an inspection system of the present invention.
Figure 2:
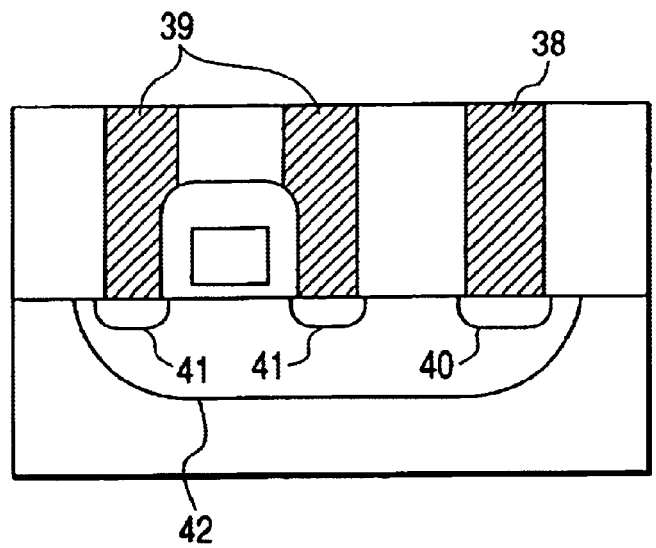
FIG. 2 is an explanatory diagram of a conventional process for inspecting open contact failure.
Figure 3:
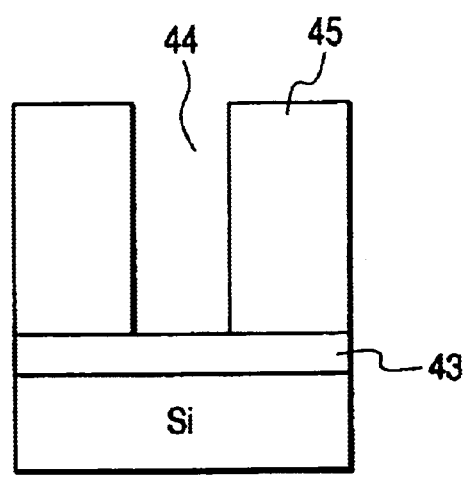
FIG. 3 is an explanatory diagram of a problems of a conventional inspection process.

An embodiment of a process for inspecting a wafer which is provided on its substrate with junctions of different kinds will be described first. FIG. 1 shows the configuration of an inspection system according to this embodiment.

The inspection system 1 for semiconductor device comprises an electron beam optics unit 2, a stage unit 3, a wafer handling unit 4, a vacuum unit 5, an optical microscope unit 6, a control unit 7, a control unit 8, and an optics unit 9. The electron beam optics unit 2 comprises an electron gun 10, a condenser lens 11, an objective lens 12, a detector 13, an energy filter 14, a deflector (for example, an EXB deflector) 15, an electrode 16 above the wafer, and an wafer-height detector. The optics unit 9 comprises an optical source 17 and a nozzle 18. The stage unit 3 comprises an XY stage 19, a wafer holder 20 to support the XY stage 19 and wafers, a wafer holder 21, and a retarding power supply 23. The XY stage 19 is fitted with a position detector which measures length with a laser beam. The wafer handling unit 4 comprises a wafer case 24 and a wafer loading unit 25. Each wafer goes from the wafer case 24 through the wafer loading unit 25 to the XY stage 19 and comes back from the XY stage 19 through the wafer loading unit 25 to the wafer case 24. The control unit 7 comprises a signal detection control unit 26, a blanking control unit 27, an beam deflector control unit 28, an electron beam optics control unit 29, a stage control unit 30, an electrode control unit 31, and an optics control unit 32. The control unit 8 comprises a graphical user interface unit 33, an image processing unit 34, an image/inspection data storage unit 35, and an outer server 36.

Figure 6:
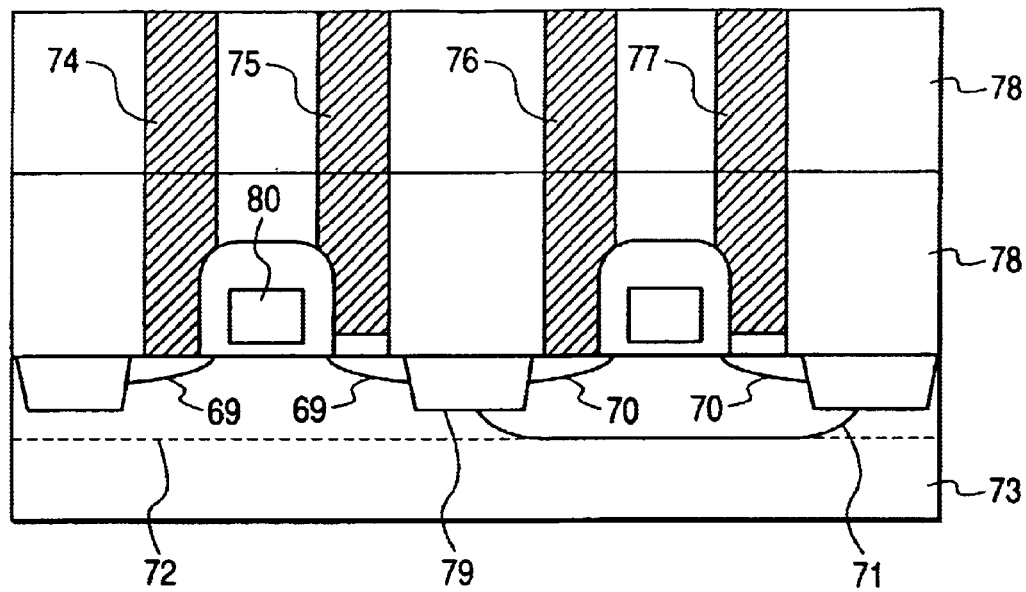
FIG. 6 is an explanatory diagram of a CMOS inspection process of the present invention.

In this embodiment, while an optical beam 37 is applied to a wafer with junctions of a number of types, an electron beam is applied to the wafer to capture a secondary-electron image for inspection. The optical source 17, which reduces the influence exerted by different types of junctions, radiates an optical beam of wavelength which is longer than the absorption edge of the insulator forming the circuit pattern, but shorter than 1,000 nm so that the Si substrate can absorb the optical beam. If the insulator is of $SiO_2$, an optical beam of wavelength of 150 to 1,000 nm is applied. If the insulator includes $Si_3N_4$, an optical beam of wavelength of 200 to 1,000 nm is applied. A laser beam of wavelength of 633 nm may be applied or an excimer laser lamp of D2, etc. may be used. By putting a wavelength-choosing filter behind an excimer laser lamp, ultraviolet rays of a specific wavelength can be obtained. Besides, an optical beam of several wavelengths can be chosen from a single optical source. Described below is a case where a laser beam of wavelength of 633 nm is applied to a circuit pattern whose cross section is shown in FIG. 6. An optical beam 37 from the optical source 17 is introduced into the vacuum chamber through a vacuum window and the insulative nozzle 18. The vacuum window may be of quartz, $MgF_4$, LiF, or the like which lets the optical beam 37 through. The nozzle 18 is to prevent the diffused reflection of the optical beam 37 in the vacuum chamber and, thereby, prevent noises so that a noise-less secondary-electron image can be captured. A mirror may be installed in the nozzle 18 to gather or deflect the optical beam and apply it onto the surface of the wafer. The optical beam 37 can evenly be applied to an area wider enough than the area which is scanned with the electron beam.

In the case when an optical beam is applied and, simultaneously, a secondary-electron image is captured, secondary electrons having a specific energy level can be detected with an energy filter 14; accordingly, noises due to secondary electrons including photo-electrons emitted because of the application of the optical beam can be removed for inspection. For example, an energy filter for acquiring secondary electrons of energy levels over a certain threshold value may be used. Noises due to the application of an optical beam 37 can be reduced by setting the threshold value below the energy level of the optical beam 37 and capturing a secondary-electron image for inspection.

Figure 5:
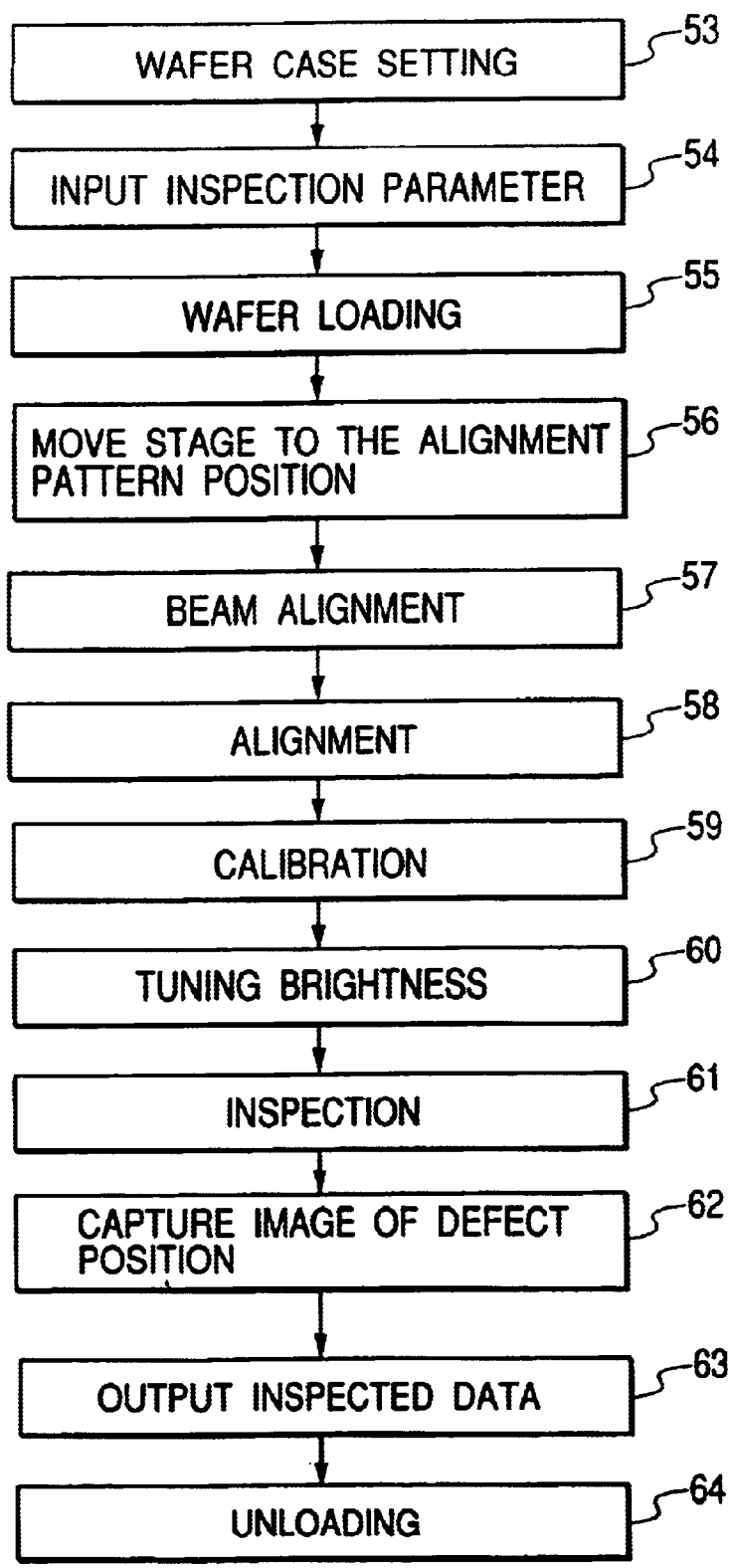
FIG. 5 is a flowchart of an inspection process of the present invention.

FIG. 5 is a flowchart of inspection of wafers for defects. The shelf No. of a wafer to be inspected in the wafer case 24 is designated on the graphical user interface unit 33 (Step 53). Then, data on the wafer such as its circuit patterns are input into the inspection system 1 thought the graphical user interface unit 33. Also inspection areas, the energy level of an electron beam to be applied to capture secondary-electron images, the current value for the electron beam, a scanning speed, and scanning size are input as the inspection parameter (Step 54). Data on wafers may be stored in a database, and necessary data may be input from the database. Besides, data on wafers, conditions for applying an electron beam, and inspection parameter may be input from the external server 36. Moreover, the wavelength and power of an optical beam to be applied, and areas to be exposed to the optical beam are input.

A wafer 22 is carried into the inspection system. First, a wafer 22 is conveyed from the wafer case 24 into the wafer loading unit 25. The air in the wafer loading unit 25 is discharged so as to turn the inside of the wafer loading unit 25 vacuum. Then, the wafer 22 is carried into the inspection chamber whose inside is already vacuum (Step 55).

After loading the wafer 22 into the inspection chamber, the electron beam optics control unit 25 sets the conditions for the application of the electron beam in relevant units of the inspection system 1 based on the above input inspection parameter. Then, the XY stage 19 moves so as to position a pattern for correcting the electron beam on the wafer holder 21 (Step 56). Then, a secondary-electron image is captured and the focus, the astigmatism, and the detecting system are adjusted to adjust the contrast, etc. of the image (Step 57). At the same time, the height of the wafer 22 is measured so that the system can focus automatically on the surface of the wafer each time a secondary-electron image is captured.

The image captured by the optical microscope unit 6 and the secondary-electron image are aligned by using two points on the wafer 22. Another secondary-electron image is captured to adjust the brightness (Step 60). The current value for the electron beam, the energy level for the application of the electron beam, the voltage to be applied to the energy filter 14, and the gains of the detector 13 and the detecting system are set according to the file of conditions for inspection in order to capture secondary-electron images. After the adjustment of the brightness, the wafer 22 is inspected (Step 61). The inspection areas are specified in the file of conditions for inspection in advance.

The process for inspecting a circuit pattern shown in FIG. 6 for discontinuity defects by using the above inspection system 1 will be described. An electron beam of the energy level of, for example, 500 eV is applied to the surface of the wafer 22 so as to electrify defective plugs of Si positively. N-type diffusion layers 69 are formed on a p-well 72, which is formed on a Si substrate 73; accordingly, depletion layers are formed at the junctions because backward bias is applied to the junctions; therefore, the Si substrate 73 does not feed the contacts 74 and 75 with electrons and hence they are electrified positively. On the other hand, p-type diffusion layers 70 are formed on an n-well 71; accordingly, forward bias is applied to the junctions; therefore, the Si substrate 73 feeds the open contact 76 with electrons, and the voltage of the surface of the contact 76 becoming 0 V. FIG. 7 is a secondary-electron image of the circuit pattern of FIG. 6. Not only the defective contact 75 but also the open contact 74 is positively electrified to look dark; therefore, it is difficult to distinguish the open contact 74 from the defective contact 75. If a laser beam of wavelength of 633 nm, in addition to the electron beam, is applied to the circuit pattern, the laser beam penetrates the insulators 78 and reaches the Si substrate 73. The laser beam produces electron-hole pairs in the Si substrate 73 and the depletion layers and excites electrons in the valence band into the conduction band; accordingly, currents flow through the junctions with the depletion layers. Thus, the Si substrate 73 feeds the open contact 74 with electrons to reduce its electrification. With a laser beam applied to the wafer 22, therefore, a secondary-electron image can be captured without being affected by the depletion layers as shown in FIG. 8. Thus, the defective contacts 75 and 77 can be detected by a single inspection. If the surface of the wafer 22 is negatively electrified, backward bias is applied to the junctions of the contacts 76 and 77; accordingly, the open contact 76 cannot be distinguished from the defective contact 77. Then, a laser beam is applied to the junctions so as to allow currents to flow through them; accordingly, the open contact 76 can be distinguished from the defective contact 77.

Figure 9:
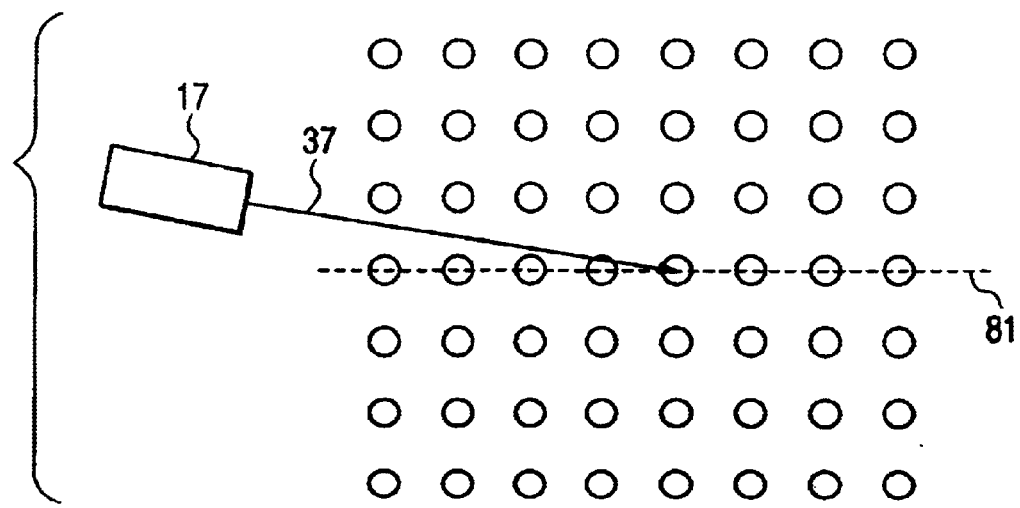
FIG. 9 is an explanatory diagram of the incident direction of an optical beam.

Now the incident direction of the above ultraviolet ray 37 will be described. FIG. 9 shows the circuit pattern of an ordinary memory where plugs line up straight. Because plugs are usually made of poly-Si or metal, the ultraviolet ray 37 cannot penetrate them. In the present embodiment, ultraviolet ray 37 is applied with a slight angle deviated from each straight line in which contacts are arranged so that the ultraviolet ray 37 can be applied to the junctions of Si substrate 73 even if the circuit pattern is dense; accordingly, the influence of the junctions are reduced and discontinuity defects can be detected.

Figure 10:
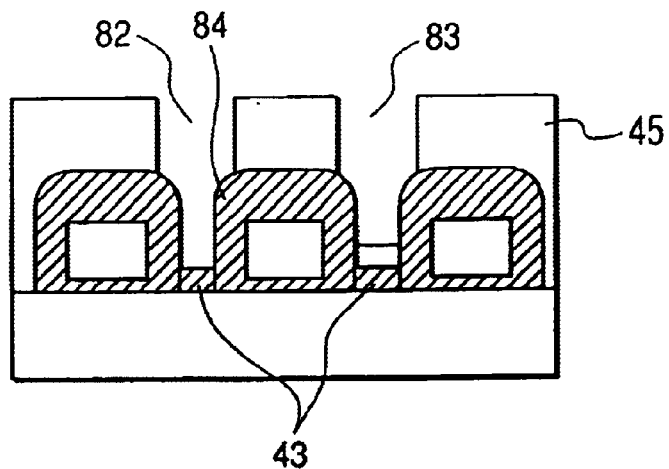
FIG. 10 is an explanatory diagram of an inspection process of the present invention.
Figure 11A:
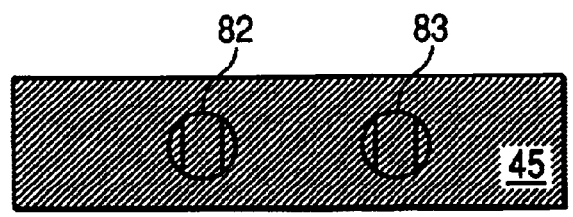
FIG. 11 shows images of secondary electrons using a conventional inspection process and an inspection process of the present invention.
Figure 11B:
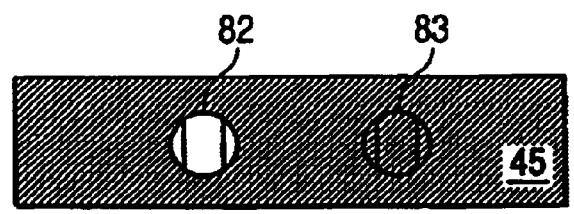

Next described is a process for detecting the open contact failure of holes formed on a base insulator of $Si_3N_4$ or the like of a circuit pattern. An optical beam of wavelength longer than the absorption edge of the insulator forming the circuit pattern and shorter than the absorption edge of the base insulator is applied to the circuit pattern to turn the top surface of the base insulator conductive. If the upper insulator 45 is of $SiO_2$ and the lower insulator 43 is of $Si_3N_4$ as shown in FIG. 10, an ultraviolet ray of wavelength of 140 to 200 nm is applied to the circuit pattern. Sources of ultraviolet rays such as ArF (wavelength: 193 nm), $Kr_2$ (wavelength: 146 nm), and Xe (wavelength: 172 nm) can be used as the optical source 17. For example, a case when an ultraviolet ray of wavelength of 193 nm is applied to a circuit pattern having a cross-section shown in FIG. 10 will be described. If only an electron beam is applied to the circuit pattern of FIG. 10 to electrify the surface of the circuit pattern positively, both the upper and lower insulators are electrified positively; accordingly, a secondary-electron image shown in FIG. 11(a) is captured. Thus, the open hole 82 cannot be distinguished from the defective hole 83. If an ultraviolet ray of wavelength of 193 nm, in addition to the electron beam, is applied to the circuit pattern of FIG. 10, the ultraviolet ray penetrates the upper insulator 45 and reaches the lower insulator 43. Because the ultraviolet ray excites electrons in the valence band into the conduction band in the $Si_3N_4$, more electrons are emitted from the bottom of the open hole 82; accordingly, the open hole 82 looks bright and the defective hole 83 looks dark as shown in FIG. 11(b). Thus, by using the above inspection method, the open contact failure of holes on an insulator of $Si_3N_4$ too can be detected.

Figure 12:
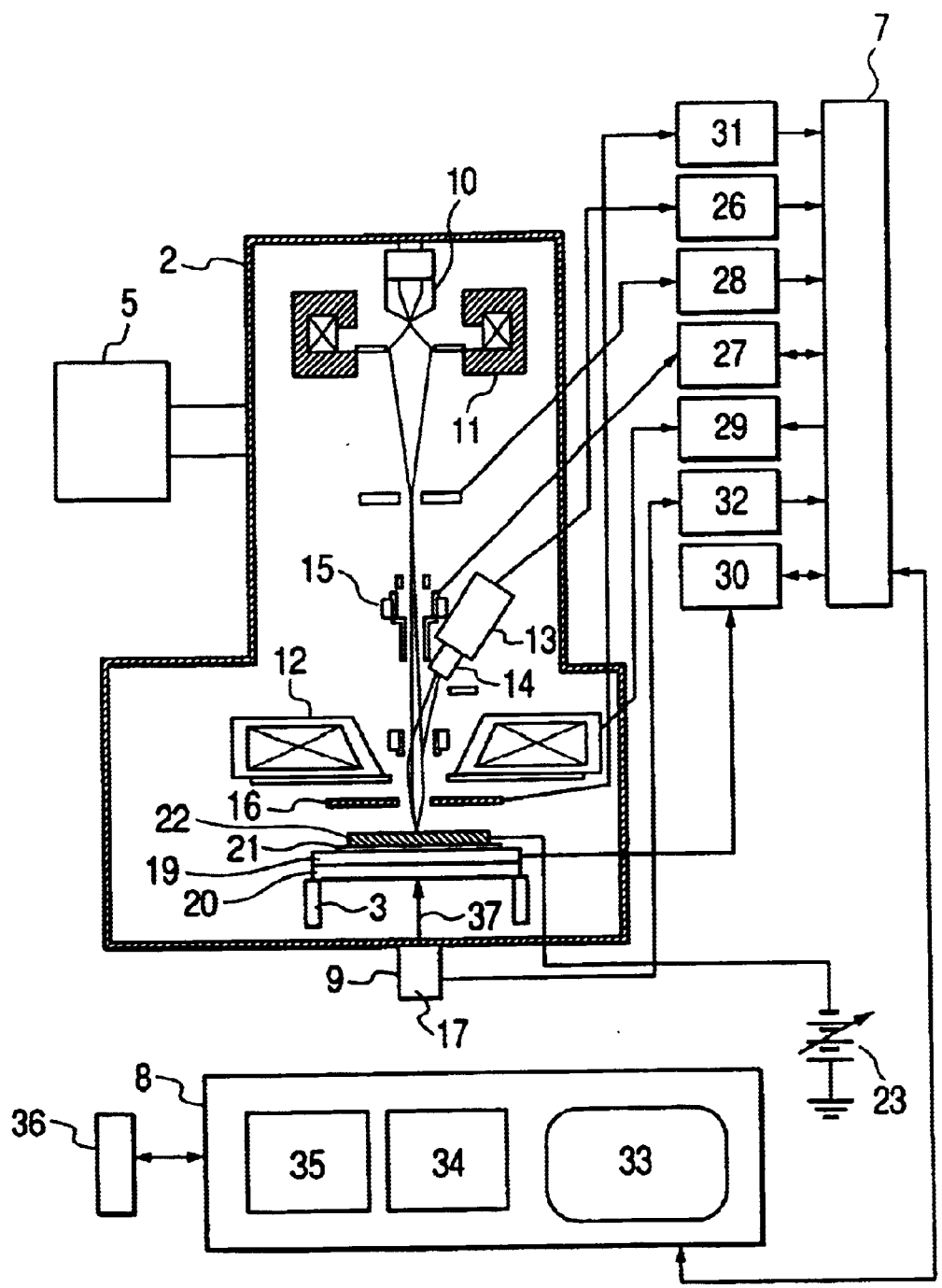
FIG. 12 is a block diagram showing an inspection system of the present invention.

If there are layers 84 of the same material as the lower insulator between the upper and lower insulators as shown in FIG. 10, it is effective to apply an optical beam to the surface of the circuit pattern at a small angle of incidence in order for more light to reach the lower insulator. FIG. 12 shows a configuration of the neighborhood of a wafer 22 under inspection for a small angle of incidence. With the configuration, an optical beam 37 is guided to the tip of the probe by using optical fiber 85 or the like and applied to the surface of the circuit pattern at a small angle of incidence, from a position by the objective lens 12. Thus, the optical beam 37 can be applied to the surface of the circuit pattern at a small angle of incidence and the base insulator can effectively be turned conductive at the bottoms of holes, making it possible to detect the open contact failure of holes on the base insulator.

The coordinates, signal values, types, size, etc. of defects are automatically recorded and defect marks are indicated at the defective spots on the wafer map on the graphical user interface unit 33. After the inspection of the areas designated by the file of conditions for inspection is completed, images of defective areas can be captured again (Step 62 in FIG. 5).

By using the methods described above, various integrated circuits can be inspected at a high sensitivity regardless of the types and materials of junctions of circuit patterns. Thus, these inspection methods contribute toward the early startup of manufacturing processes of integrated circuits and early measures against defects.

(Second Embodiment)

Figure 13:
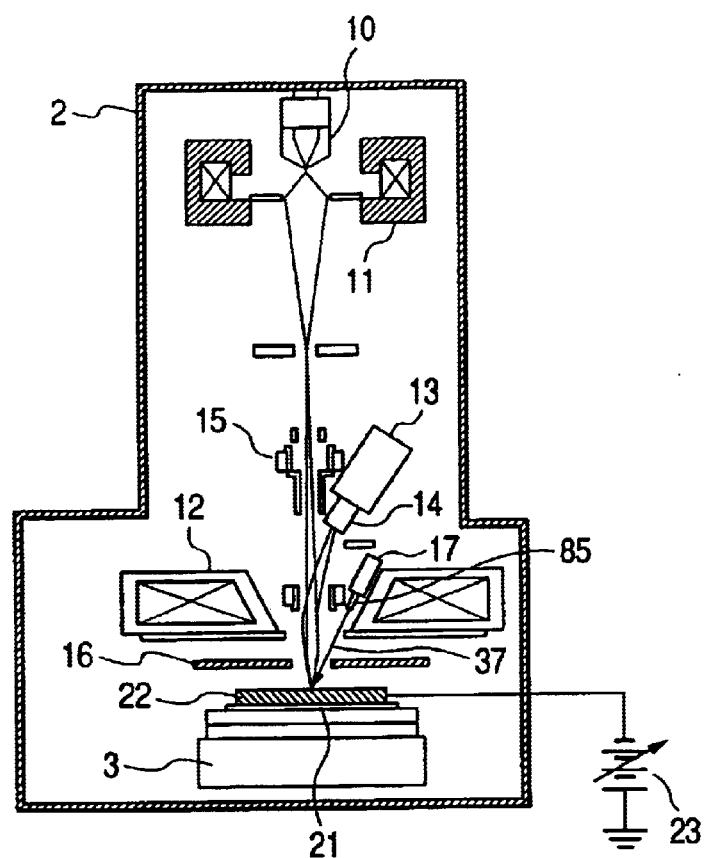
FIG. 13 is a block diagram showing an inspection system of the present invention.

In this embodiment, a laser beam 37 is applied from below a wafer 22 to its back to detect discontinuity. FIG. 13 shows an inspection system 1 according to this embodiment. The inspection system 1 comprises an electro-optical unit 2, a stage unit 3, a wafer handling unit 4, a vacuum unit 5, an optical microscope unit 6, a control unit 7, an operating unit 8, and a laser unit 9. All the units, except the laser unit 9, of this second embodiment are the same as those of the first embodiment. A laser beam 37 from an optical source 17 enters a vacuum chamber through a window of a material which lets the laser beam through. The laser beam 37 introduced into the vacuum chamber are applied from the back of a wafer 22. The XY stage 19, the wafer holder 20, and the wafer holder 21 have a window for the application of the laser beam 37. Those windows are made of a material which lets the laser beam 37 through. On the other hand, an electron beam 51 for capturing an image for inspection is applied from above the wafer 22. The laser beam 37 and the electron beam 51 can be applied to the same spot simultaneously from below and above the wafer 22, respectively. While the laser beam 37 is applied from below the wafer 22, a secondary-electron image of the surface of the wafer 22 can be captured. When the secondary-electron image is captured, secondary electrons excited by the laser beam 37, however, cause noises in the secondary-electron image. Such noises can be removed by detecting secondary electrons of a specific energy level with the energy filter 14. The energy filter 14 may acquire secondary electrons of energy levels over a certain threshold value.

Some integrated circuits such as CMOS have different types of junctions formed in each. First described is a process for inspecting a wafer with different types of junctions by applying an electron beam from the front and a laser beam from the back of the wafer and capturing a secondary-electron image for inspection.

Figure 7A:
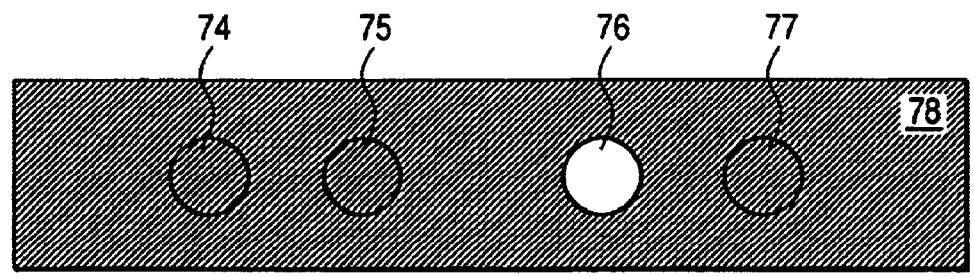
FIG. 7 shows an image of secondary electrons using a conventional inspection process.
Figure 7B:
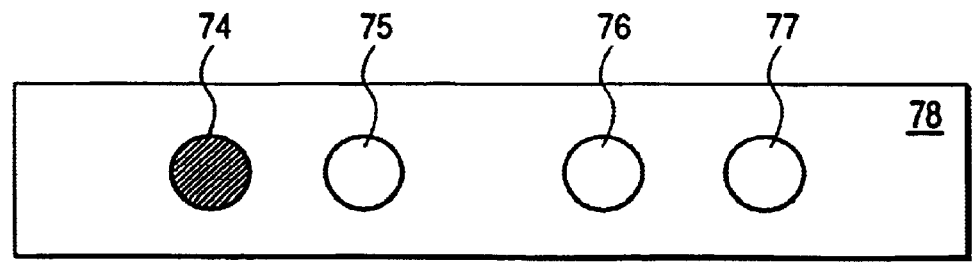
Figure 8A:
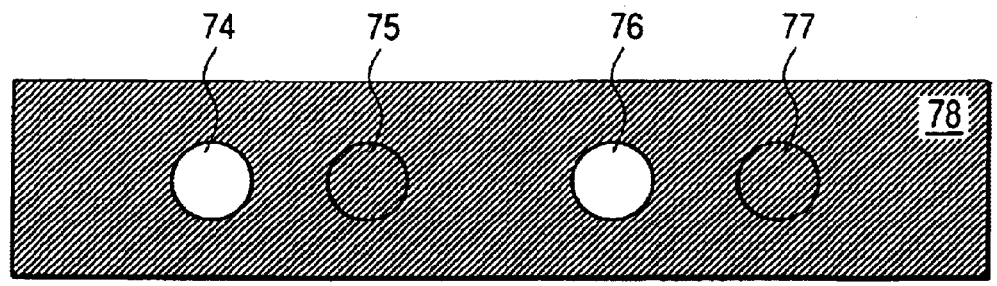
FIG. 8 shows an image of secondary electrons using an inspection process of the present invention.
Figure 8B:
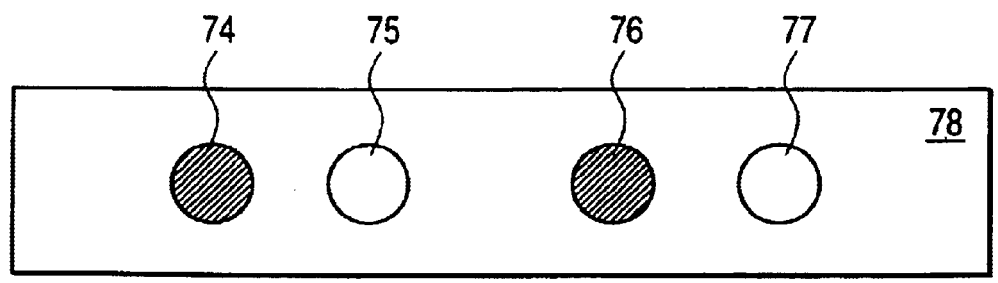

According to conventional inspection methods, when the circuit pattern of FIG. 6 is electrified positively, the open contact 74 as well as the defective contact 75 is electrified positively, the secondary electrons producing an image shown in FIG. 7(a), as is described earlier. Thus, it is difficult to distinguish the open contact 74 from the defective contact 75. In this inspection process, a laser beam 37 of wavelength of 900 to 1,200 nm is applied to the wafer 22 from its back side. Such a laser beam excites electrons in the junctions and penetrates not only the Si substrate 73 but also materials such as insulators of oxide films, etc. When the laser beam 37 is applied to the wafer 22 from its back, the laser beam 37 penetrates the Si substrate 73 to reach the junctions. The laser beam 37 excites electrons in the valence band into the conduction band; accordingly, even when an electron beam is applied to the wafer 22 so as to apply backward bias to the junctions, the Si substrate 73 and the junction corresponding to the contact 74 feed the contact 74 with electrons to reduce its electrification. Thus, a secondary-electron image shown in FIG. 8, wherein the influence of depletion layer corresponding to the contact 74 is reduced, can be captured. Thus, the defective contacts 75 and 77 can be detected by a single inspection.

Because the laser beam 37 is applied to the wafer 22 from its back in this inspection process, the wafer 22 can be inspected regardless of the shapes and materials of patterns formed on the Si substrate 73. Besides, as the laser beam 37 penetrates oxide films, it is also effective in inspecting circuit patterns formed on oxide films such as SOI wafers. It is preferable to provide the backs of the XY stage 19, the wafer holder 20, and the wafer holder 21 with windows for the application of the laser beam 37. If the backs of the XY stage 19, the wafer holder 20, and the wafer holder 21 are made of materials such as poly-Si which lets the laser beam 37 through, the wafer 22 can be inspected without providing the stage and holders with windows.

Figure 4:
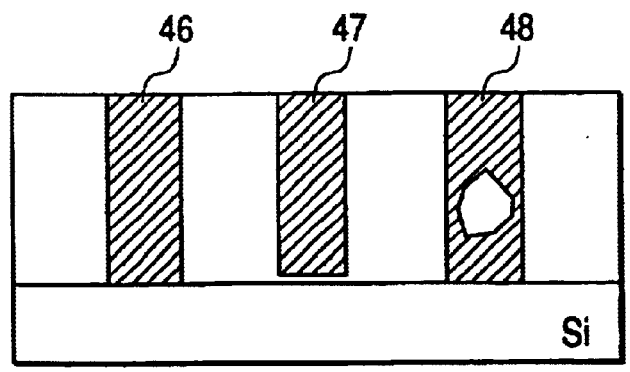
FIG. 4 is an explanatory diagram of types of open contact failure.

Described next is another inspection process according to the present invention, which enables the inspector to detect defects such as open contact failure due to a residue at the bottom of a hole 47 and disconnection caused by void in a contact 48 as shown in FIG. 4 and distinguish the types of defects from one another. According to conventional inspection methods, when a circuit pattern of FIG. 4 is electrified positively, both the defective contacts 47 and 48 are electrified positively. Accordingly, it is difficult to distinguish the defects of the contacts 47 and 48 from each other. According to the inspection process of the present invention, a secondary-electron image can be captured while a laser beam 37 is applied to the wafer 22 from its back. The wavelength of the laser beam 37 is 900 nm or longer. Such a laser beam excites electrons in the wiring parts and penetrates not only the Si substrate 73 but also materials such as insulators of oxide films, etc. When the laser beam 37 is applied to the wafer 22 from its back, the laser beam 37 penetrates the Si substrate 73 to reach the defects. The laser beam 37 is absorbed by the junctions or the wiring parts. The energy of the laser beam 37 gives rise to thermo-electromotive force at the defects in the wiring parts. The thermo-electromotive force causes the resistance of the defects to change. The changes of the resistance of the defects cause the electric potential of the defects to change, which causes the contrasts of the defects in the secondary-electron image to change. Because such thermo-electromotive force differs from defect to defect, the changes of contrasts of defects in a secondary-electron image differ from one another. Thus, different kinds of defects can be distinguished from one another based on a secondary-electron image with the application of a laser beam 37 and one without the application of the same.

According to the above inspection process of the present invention, because a laser beam 37 is applied to the wafer 22 from its back, the wafer 22 can be inspected regardless of the shapes and materials of patterns formed on the Si substrate 73. Besides, as the laser beam 37 of wavelength of 900 nm or longer penetrates oxide films, it is also effective in inspecting circuit patterns formed on oxide films such as SOI wafers. It is preferable to provide the backs of the XY stage 19, the wafer holder 20, and the wafer holder 21 with windows for the application of the laser beam 37. If the backs of the XY stage 19, the wafer holder 20, and the wafer holder 21 are made of materials such as poly-Si which lets the laser beam 37 through, the wafer 22 can be inspected without providing the stage and holders with windows.

If the circuit patterns of a wafer 22 is relatively simple, the wafer 22 can be inspected and detected defects can be distinguished from one another by using the inspection process of the first embodiment, wherein a optical beam 37 is applied to the wafer 22 from its front. In this case, an optical beam whose wavelength is longer than the absorption edge of the insulator and shorter than the absorption edge of the wiring material is applied to the surface of the wafer 22. If the insulators are of $SiO_2$ and the wiring material is of poly-Si, an optical beam of wavelength of 150 to 1,000 nm is applied to the surface of the wafer 22. If the insulators contain $Si_3N_4$, an optical beam of wavelength of 200 to 1,000 nm is applied to the surface of the wafer 22. In these cases, the optical beam 37 penetrates the insulators and absorbed by wiring parts. If there are open contact failure due to a residue at the bottom of a hole and disconnection caused by void in a wiring part, the energy of the optical beam 37 gives rise to thermo-electromotive force in the defects, as in the case of the application of the laser beam 37 from the back of the wafer 22. The thermo-electromotive force causes the resistance of the defects to change. The changes of the resistance of the defects cause the electric potential of the defects to change, which causes the contrasts of the defects in the secondary-electron image to change. Because such thermo-electromotive force differs from defect to defect, the changes of contrasts of defects in a secondary-electron image differ from one another. Thus, different kinds of defects can be distinguished from one another based on a secondary-electron image with the application of an optical beam 37 and one without the application of the same.

(Third Embodiment)

Still another embodiment of the present invention will now be described. The feature of this embodiment is to stabilize the electrification of the surface of the wafer and, thereby, capture a stable secondary-electron image.

Figure 14:
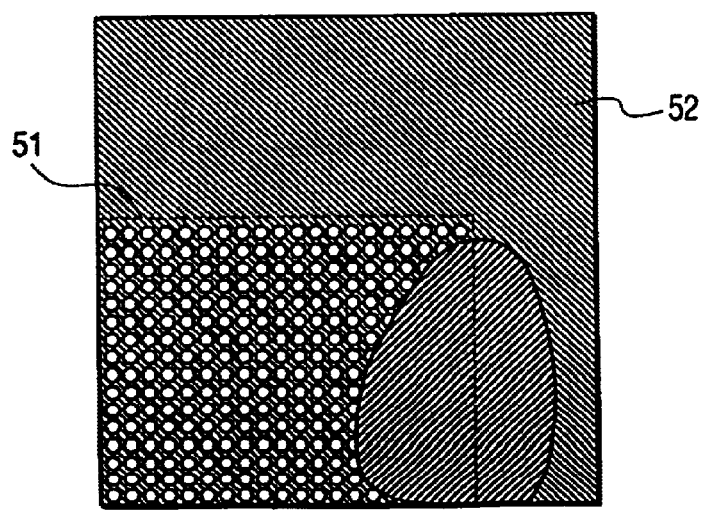
FIG. 14 shows an example of unevenness in the secondary-electron image due to extraordinary electrification.
Figure 15A:
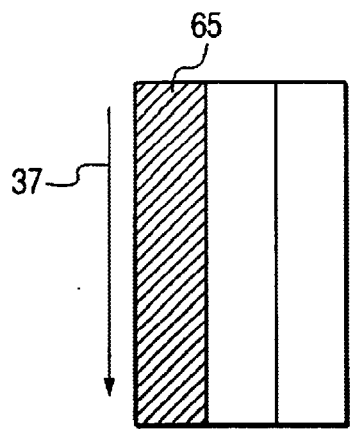
FIG. 15 shows explanatory diagrams of scanning processes of an electron beam and optical beams.
Figure 15B:
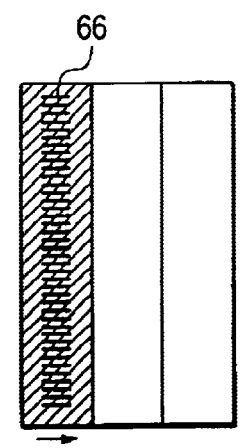
Figure 15C:
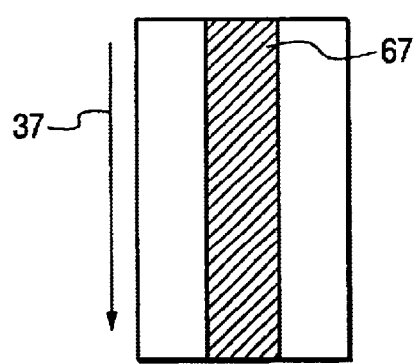
Figure 15D:
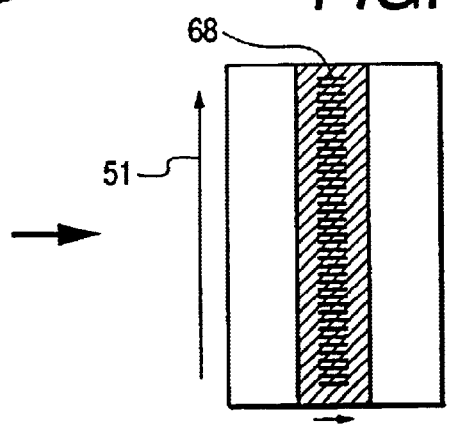
Figure 15E:
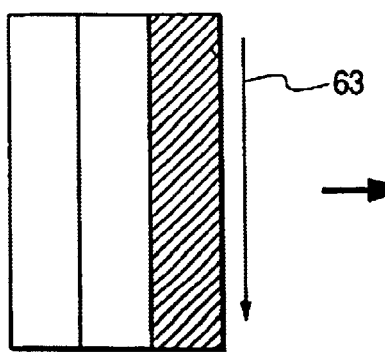
Figure 15F:
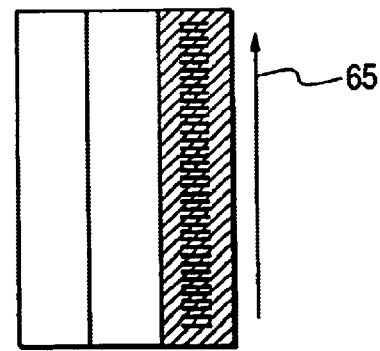

During the inspection of a wafer with a conventional inspection device, the surface of the wafer may extraordinarily be electrified depending upon its circuit patterns if insulating material is used in at least one area in the circuit of the wafer. Local extraordinary electrification may take place, disturbing even overall electrification, which disturbs the secondary-electron image and the inspection of the wafer. If extraordinary electrification takes place on the surface of the wafer or two adjacent areas differ largely from each other in electric potential, the primary-electron beam is slightly displaced and the secondary-electron image is disturbed. FIG. 14 shows a wafer which includes an area 51 dense with conductors and an area 52 dense with an insulating material. In this case, there occurs extraordinarily difference in electric potential between them and the secondary electrons emitted along the border between them fail to reach the detector 13, rendering the inspection of the border difficult. In the case of a circuit pattern formed on an insulator or a dielectric film, it is easily electrified by an electron beam because it is insulated electrically from the Si substrate. Accordingly, the secondary-electron image is slightly displaced and disturbed or the circuit pattern under inspection is deformed in the captured image. Japanese Patent Laid-Open No. 357483/2000 discloses a process for removing the electrification of the surface of a wafer by applying ultraviolet rays to the surface of the wafer while the secondary-electron image is not being captured. According to this method, a charged-particle beam and ultraviolet rays for removing electrification are alternately applied to the surface of a wafer; therefore, the electrification all over the area where the charged-particle beam is applied can be removed, but it is difficult to remove the local unevenness in the secondary-electron image due to the electrification of the wafer. On the other hand, unevenness in the secondary-electron image due to extraordinary electrification or uneven electrification can be reduced to a certain extent by optimizing the conditions of application of an electron beam. With the diversification of integrated circuits, however, it is not easy to optimize the conditions of application of an electron beam for every kind of integrated circuits.

In this embodiment of the present invention, there is provided a means for making the electrification of the surface of a wafer even and capturing the secondary-electron image by applying an electron beam while applying an optical beam to an area wider enough than the area of the application of the electron beam. In this embodiment, the inspection system 1 of FIG. 1 can be used. To stabilize the electrification of the surface of a wafer, an optical beam, whose wavelength is shorter than the absorption edge of the insulators forming circuit patterns, is used. If the surface of an insulator is of $SiO_2$, an ultraviolet ray of wavelength of 150 nm or shorter is applied to the surface of the insulator. If an ultraviolet ray of wavelength of 126 nm is applied to the surface of the insulator, electrons in the valence band at the surface of the insulator are excited and rise into the conduction band to become conduction electrons. Thus, only the surface of the insulator is made conductive. Excimer laser lamps of D2 or the like, the third higher harmonic waves of YAG lasers (wavelength: 118 nm), and excimer laser of $Ar_2$ (wavelength: 126 nm) can be used as the source of ultraviolet rays 17. An ultraviolet ray of a specific wavelength can be obtained by putting a wavelength-choosing filter behind an excimer laser lamp of D2. Several wavelengths can be chosen from a single source of ultraviolet rays. Therefore, the first and second embodiments and this third embodiment can be carried out with one and the same inspection system in accordance with a circuit pattern of a wafer to be inspected. An excimer laser lamp of $Ar_2$ (wavelength: 126 nm) taken as the source of ultraviolet rays 17, this third embodiment will further be described below. An ultraviolet ray 37 from the source of ultraviolet rays 17 is introduced into the vacuum chamber through a vacuum window and the insulative nozzle 18. The window is made of a material such as $MgF_2$, LiF, or the like which lets the ultraviolet ray 37 through. The nozzle 18 is to prevent the diffused reflection of the ultraviolet ray 37 in the vacuum chamber and, thereby, prevent noises so that a noise-less secondary-electron image can be captured. A mirror may be installed in the nozzle 18 to gather or deflect the light and apply it to the surface of the wafer. The ultraviolet ray 37 can evenly be applied to an area wider enough than the area which is scanned with the electron beam.

In the case when an ultraviolet ray 37 is applied and, simultaneously, a secondary-electron image is captured, secondary electrons of a specific energy level can be detected with the energy filter 14; accordingly, noises due to secondary electrons including photo-electrons emitted because of the application of the ultraviolet ray 37 can be removed for inspection. A monochromator may be used instead of the energy filter 14. The energy filter 14 may acquire secondary electrons of energy levels over a certain threshold value. Noises due to radiation of the ultraviolet ray 37 can be reduced by setting the threshold value below the energy level of the ultraviolet ray 37 and capturing a secondary-electron image for inspection.

According to conventional inspection methods, secondary-electron images may be disturbed due to the electrification of the surface of the wafer and become partially not observable. As a general rule, when an electron beam is applied to the surface of an insulator, the surface is electrified because secondary electrons are emitted from the surface. In the case of a dielectric pattern floating in an insulator or a pattern formed on an SOI wafer in particular, extraordinary electrification occurs locally in the pattern, making it difficult to capture a secondary-electron image for inspection. If (i) an electron beam is applied to the surface of an insulator while an ultraviolet ray is applied to the surface in order to make the surface conductive and (ii) extraordinary electrification is about to take place on the surface, electrons in the area of application of the electron beam and its neighborhood moves to reduce the electrification; accordingly, local extraordinary electric-potential difference does not occur in the area scanned with the electron beam. Thus, stable secondary-electron images can be captured for inspection of high sensitivity.

(Fourth Embodiment)

Further, according to the present method, by electrifying the surface of a wafer positively or negatively before inspection and capturing a secondary-electron image to enhance contrasts in electric potential, a speedy and highly sensitive inspection can be made. In the present embodiment, an example of the method is described, wherein the surface of a wafer is positively electrified by an optical beam and the wafer is inspected speedily and at a high sensitivity.

According to conventional methods, by applying an electron beam prior to inspection, electrifying the surface of the wafer positively or negatively in advance and capturing a secondary-electron image, contrasts in electric potential are enhanced to achieve a highly sensitive inspection. However, in a method of acquiring contrasts in electric potential after applying an optical beam to the wafer surface, it takes a considerable time to electrify the wafer surface by scanning with an electron beam 49 before inspection. Also, it is difficult to have the wafer surface electrified evenly.

In the present embodiment, a means is provided to electrify the wafer surface evenly by applying an optical beam before or during the application of the electron beam 50. Further, an electrode is placed above the wafer, and a means is provided to electrify the surface of the wafer positively by applying voltage higher than that of the wafer surface and controlling the electric field on the wafer surface. In this embodiment, the inspection system of FIG. 1 can be used.

First, in the present embodiment, a process to electrify the surface of a wafer positively will be described. The wafer surface can be electrified by applying an optical beam 37 thereto. Alternatively, by applying the optical beam 37 and electrifying positively, relative to the wafer 22, the electrode 16 placed on the upper surface of the wafer 22, an electric field is generated there and the wafer-surface voltage can be controlled. An optical beam of wavelength shorter than the absorption edge of the insulator forming the circuit pattern is applied. If the insulator is of $SiO_2$, for example, an ultraviolet ray, whose wavelength is 150 nm or shorter, is applied. Like in the first embodiment, excimer laser lamps of Ar$_2$ (wavelength: 126 nm), D2 and so on, the third higher harmonic waves of YAG lasers (wavelength: 118 nm) and excimer laser of Ar$_2$ (wavelength; 126 nm) can be used as the source of ultraviolet rays. If insulators are of Si$_3$N$_4$, an ultraviolet ray of wavelength of 200 nm or shorter is applied. In the case, for example, when an insulator formed on a circuit pattern is of SiO$_2$, a process to electrify the wafer surface positively will be described. If an ultraviolet ray of wavelength of 126 nm, for example, is applied to the surface of the insulator of SiO$_2$, electrons in the valence band at the surface are excited to a vacuum level by photo-electric effect. Therefore, electrons generated by the photo-electric effect are emitted into the vacuum chamber from the SiO$_2$ surface or diffused inside the insulator so that the whole area to which the ultraviolet ray is applied becomes positively electrified. When the electrode is positively electrified with respect to the wafer as the ultraviolet ray is applied, electrons are drawn from the surface of the wafer to enhance the emission rate of the secondary electrons therefrom. Thus, a positive surface voltage of the wafer 22 can be effectively produced. By adjusting the voltage of the electrode 16, the wafer-surface voltage can be controlled. By giving an even electric potential to an area exposed to the ultraviolet ray and the electrode 16, it becomes possible to evenly electrify an area wider enough than the area which is scanned with the electron beam. As a result, an even image of the secondary electrons can be captured.

In a scanning method of an optical beam 37 for electrifying a wafer and an electron beam for capturing an image for inspection, the wafer is divided into several inspection areas. By electrifying the wafer 22 and capturing the image of the secondary electrons alternately, a positive wafer-surface voltage is effectively produced while the wafer moves, enabling the inspection to be carried out. FIG. 15 shows an example of a scanning method of the optical beam 37. First of all, with the prescribed voltage of the electrode 16, the optical beam 37 with a pre-set parameter is applied to an area 65 to be scanned as in FIG. 15($a$). Then, by having the electron beam 51 for detecting the secondary electrons scan the first scanning area 66, as shown in FIG. 15($b$), an image of the secondary electrons is captured. At this time, the image of the secondary electrons is captured while the voltage of the electrode 16 is switched to the value of capturing images. Then, as shown in FIG. 15($c$), the voltage of the electrode is switched to the set value when it was electrified, and the optical beam 37 is applied to the second areas 67 to be exposed. Then, the electrode voltage is again switched to the set value when the image of the secondary electrons is captured, and a second scanning area 68 is scanned with the electron beam 51 for detecting the secondary electrons. At this time, the optical beam 37 can be applied while the wafer 22 is being moved. Since the optical beam 37 can be applied while the wafer 22 is moving, it becomes possible to inspect without taking excessive time for electrifying the wafer.

Figure 16:
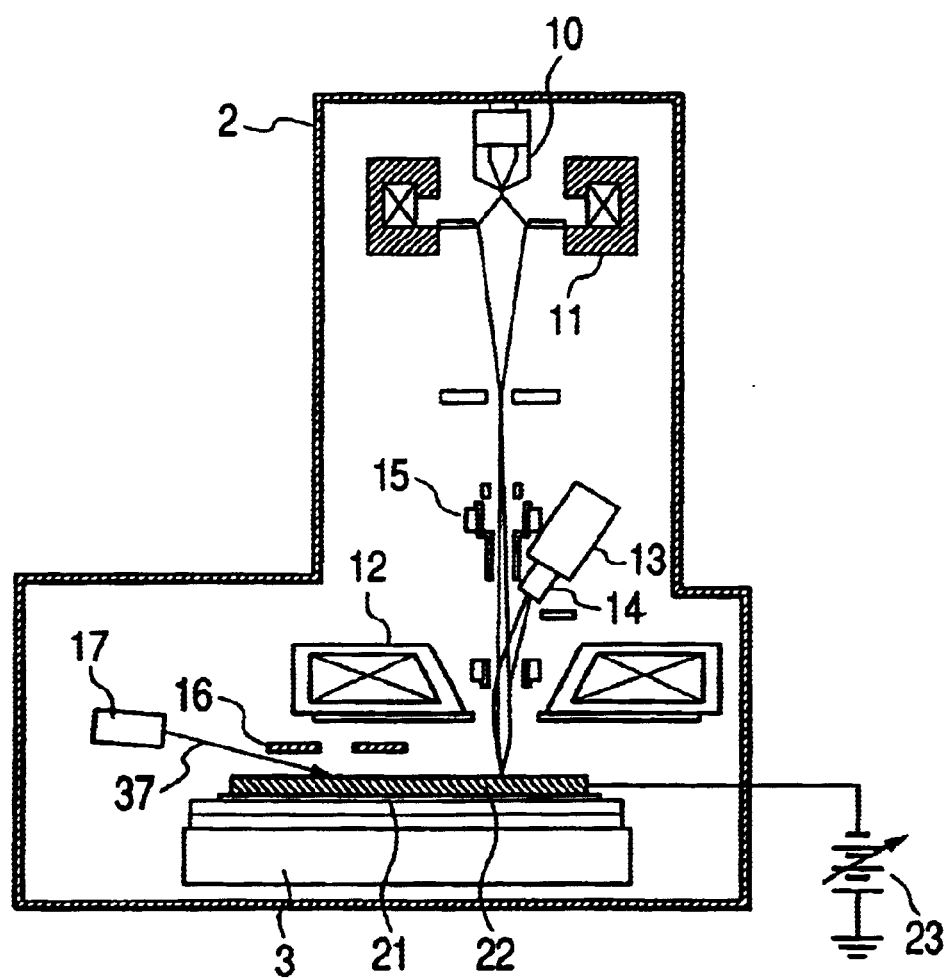
FIG. 16 is a block diagram showing an inspection system of the present invention.

Also, as shown in FIG. 16, an optical source 17 for electrifying the wafer and the electrode 16 for controlling the voltage when the wafer is electrified may be provided being displaced from an optical axis of an electronic optical system 2 so that electrification of the detection of the image of the secondary electrons can be carried out in sequence in the same vacuum chamber. A method to remove a noise entering the secondary electron detector due to the application of the optical beam 37 is also possible. Namely, voltage is applied to an energy filter 14 placed in front of the detector 13 so that the second electrons sorted by energy can be detected.

According to the method described above, the surface of a wafer can be positively electrified speedily and stably, enabling a speedy and highly sensitive inspection.

Further, in a conventional method for electrifying a wafer surface positively using an electron beam, a potential distribution had to be formed such that it can simultaneously control the electron beam to be applied to electrify the wafer, the electron beam to be applied to capture the inspection image and the direction in which secondary electrons are emitted from the wafer. Therefore, it was difficult to satisfy the conditions applicable to various types of semiconductor circuits. However, through the provision of a means to electrify a wafer surface by applying an optical beam and the use of an electrode condition to form a potential distribution which can control only the electron beam to be applied when capturing an inspection image and the direction in which secondary electrons are emitted from the wafer, it becomes possible to carry out the inspection. Accordingly, it has become much easier to determine an inspection parameter for each wafer.

To summarize, a first aspect of the process comprises the steps of: applying a primary charged-particle beam from a source of charged particles to the wafer to scan it with the beam; applying an optical beam to the wafer; detecting secondary charged particles from the wafer; and inspecting the continuity and discontinuity of the circuit based on changes of contrasts of detected signals.

A second aspect of the process comprises the steps of: electrifying the wafer in advance with a primary charged-particle beam from a first source of charged particles; applying a primary charged-particle beam from a second source of charged particles to the wafer to scan it with the beam; applying an optical beam to the wafer; detecting secondary charged particles from the wafer; and inspecting the continuity and discontinuity of the circuit based on changed of contrasts of detected signals.

To be specific, the above first source of charged particles and the second source of charged particles may be the same.

To be more specific, the wavelength of the optical beam used in the above step of applying the optical beam includes wavelength of 200 to 1,200 nm. To be more specific, the wavelength of the optical beam used in the above step of applying the optical beam includes wavelength of 200 to 1,200 nm.

Further, in the above step of applying the optical beam, such an optical beam is an infrared ray which is applied to the wafer from the back side of the wafer.

A third aspect of the process comprises the steps of: applying a primary charged-particle beam from a source of charged particles to the wafer to scan it with the beam, patterns of the circuits being formed by insulators; applying an optical beam to the wafer; detecting secondary charged particles from the wafer; turning the surfaces of the insulators conductive selectively in accordance with the materials of the insulators; and inspecting the continuity and discontinuity of the circuit based on changes of contrasts of signals detected from the secondary charged particles. To be specific, in the above step, an optical beam is used to turn the surfaces of the insulators conductive. Further, the wavelength of the optical beam used in the above step of applying the optical beam includes wavelength of 150 to 200 nm.

A fourth aspect in the above description is a system comprising: a wafer holder on which the wafer is placed; a source of charged particles; a deflector to deflect a primary charged-particle beam from the source of charged particles to scan the wafer with the beam; an objective lens for applying the primary charged-particle beam to the wafer; an optical source for applying an optical beam to the wafer; and an inspection unit for applying the optical beam from the optical source to the wafer, detecting secondary charged particles from the wafer, recording an secondary charged-particle image, and inspecting the continuity and discontinuity of the circuit based on contrasts of the recorded image.

Further, in the above system, the optical source is positioned under the wafer holder.

Still further, in the above system, a filter may be disposed between the optical source and the wafer holder.

A fifth aspect of the process comprises the steps of: applying a primary charged-particle beam from a source of charged particles to the wafer to scan it with the beam, circuit patterns of the circuit being electrically insulated from the back surface of the wafer; applying an optical beam to the front surface of the wafer to stabilize the electric potential of the front surface; and inspecting the wafer for defective circuit patterns based on signals from secondary charged particles from the wafer.

To be specific, the wavelength of the optical beam in the above step is 150 nm or shorter.

Further, in the above step, the primary electron beam and the optical beam are simultaneously applied to the wafer.

A sixth aspect of the process comprises the steps of: applying a primary charged-particle beam from a source of charged particles to the wafer to scan it with the beam; applying an optical beam to surfaces of members forming the circuit patterns to electrify the front surface of the wafer positively; and inspecting the wafer for defective circuit patterns based on signals from secondary charged particles from the wafer.

To be specific, the wavelength of the optical beam in the above step is 150 nm or shorter.

To be more specific, in the above step of electrifying the front surface of the wafer positively, a mechanism is used for adjusting the potential of an electrode which is disposed above the wafer to adjust the potential of the front surface of the wafer.

As described above, the object of the present invention is to inspect the state of electrical connection without having a probe physically contact a circuit pattern on a wafer. Namely, it is to inspect the electric property (continuity and discontinuity of a circuit pattern) at a wafer inspection stage prior to probing. Particularly, in a state where an optical beam is applied to p-n junctions to reduce resistance to let currents flow so that positive voltage is produced, it is determined to be defective when the brightness is low compared to its neighborhood. On the other hand, when negative voltage is produced there, the brighter portion is determined to be defective.

According to the present invention, various integrated circuits can be inspected at a high sensitivity regardless of the types and materials of circuit patterns. Further, it becomes possible to carry out the detection by classifying the types of detected defects. Further, extraordinary electrification of the circuit pattern is prevented, an area to be exposed to an electron beam can be evenly electrified, an image of secondary electrons is detected speedily and stably, and a highly sensitive inspection is made possible. Thus, these inspection methods contribute to the early setup of manufacturing processes of integrated circuits and early measures against defects, increasing the reliability and productivity of the semiconductor devices.

What is claimed is:

1. A process for inspecting a wafer with a circuit using a charged-particle beam, comprising the steps of:

applying a primary charged-particle beam from a source of charged particles to the wafer to scan it with the beam;

applying an optical beam to the wafer before or during said a primary charged-particle beam is being applied on the wafer;

detecting secondary charged particles from the wafer, and inspecting the continuity and discontinuity of the circuit based on changes of contrasts of detected signals.

2. A process for inspecting a wafer with a circuit using a charged-particle beam, comprising the steps of:

electrifying the wafer in advance with a primary charged-particle beam from a first source of charged particles;

applying a primary charged-particle beam from a second source of charged particles to the wafer to scan it with the beam;

applying an optical beam to the wafer before or during said a primary charged-particle beam is being applied on the wafer;

detecting secondary charged particles from the wafer, and inspecting the continuity and discontinuity of the circuit based on changes of contrasts of detected signals.

3. A process for inspecting a wafer with a circuit using a charged-particle beam according to claim 1, wherein the wavelength of the optical beam used in the step of applying an optical beam includes wavelength of 200 to 1,200 nm.

4. A process for inspecting a wafer with a circuit using a charged-particle beam according to claim 1, wherein the wavelength of the optical beam used in the step of applying an optical beam includes wavelength of 900 to 1,200 nm.

5. A process for inspecting a wafer with a circuit using a charged-particle beam according to claim 1, wherein the optical beam is an infrared ray applied to the wafer from the back side of the wafer.

6. A process for inspecting a wafer with a circuit using a charged-particle beam, comprising the steps of:

applying a primary charged-particle beam from a source of charged particles to the wafer to scan it with the beam, patterns of the circuit being formed by insulators;

applying an optical beam to the wafer before or during said a primary charged-particle beam is being applied on the wafer;

detecting secondary charged particles from the wafer;

turning the surfaces of the insulators conductive selectively in accordance with the materials of the insulators, and inspecting the continuity and discontinuity of the circuit based on changes of contrasts of signals detected from the secondary charged particles.

7. A process for inspecting a wafer with a circuit using a charted-particle beam according to claim 6, wherein an optical beam is used to turn the surfaces of the insulators conductive.

8. A process for inspecting a wafer with a circuit using a charged-particle beam according to claim 6, wherein the wavelength of the optical beam is 150 to 200 nm.

9. A system for inspecting a wafer with a circuit using a charged-particle beam, comprising:

a wafer holder on which the wafer is placed;

a source of charged particles;

a deflector to deflect a primary charged-particle beam from the source of charged particles to scan the wafer with the beam;

an objective lens for applying the primary charged-particle beam to the wafer;

an optical source for applying an optical beam to the wafer, and an inspection unit for applying the optical beam from the optical source to the wafer before or during said a primary charged-particle beam is being applied on the wafer, detecting secondary charged particles from the wafer, recording a secondary charged-particles image, and inspecting the continuity and discontinuity of the circuit based on contrasts of the recorded image.

10. A system for inspecting a wafer with a circuit using a charged-particle beam according to claim 9, wherein a filter is disposed between the optical source and the wafer holder.

11. A system for inspecting a wafer with a circuit using a charged-particle beam according to claim 9, wherein the wavelength of the optical beam is 900 to 1,200 nm.

12. A system for inspecting a wafer with a circuit using a charged-particle beam according to claim 9, wherein the optical beam is applied to the wafer from its back side.

13. A process for inspecting a wafer with a circuit using a charged-particle beam, comprising the step of:

applying a primary charged-particle beam from a source of charged particles to the wafer to scan it with the beam, circuit patterns of the circuit being electrically insulated from the back surface of the wafer;

applying an optical beam to the front surface of the wafer to stabilize the electric potential of the front surface before or during said a primary charged-particle beam is being applied on the wafer; and inspecting the wafer for defective circuit patterns based on signals from secondary charged particles from the wafer.

14. An inspection process according to claim 13, wherein the wavelength of the optical beam is 150 nm or shorter.

15. An inspection process according to claim 13, wherein the primary electron beam and the optical beam are simultaneously applied to the wafer.

16. A process for inspecting a wafer with a circuit using a charged-particle beam, comprising the steps of:

applying a primary charged-particle beam from a source of charged particles to the wafer to scan it with the beam, circuit patterns of the circuit being electrically insulated from the back surface of the wafer;

applying an optical beam to surfaces of members forming the circuit patterns to electrify the front surface of the wafer positively before or during said a primary charged-particle beam is being applied on the wafer, and inspecting the wafer for defective circuit patterns based on signals from secondary charged particles from the wafer.

17. A process for inspecting a wafer with a circuit according to claim 16, wherein the wavelength of the optical beam is 150 nm or shorter.

18. A process according to claim 16, wherein used in the step of electrifying the front surface of the wafer positively is a mechanism for adjusting the potential of an electrode which is disposed above the wafer to adjust the potential of the front surface of the wafer.

19. A process for inspecting a wafer with a circuit using a charged-particle beam according to claim 2, wherein the wavelength of the optical beam used in the step of applying an optical beam includes wavelength of 200 to 1,200 nm.

20. A process for inspecting a wafer with a circuit using a charged-particle beam according to claim 2, wherein the wavelength of the optical beam used in the step of applying an optical beam includes wavelength of 900 to 1,200 nm.

21. A process for inspecting a wafer with a circuit using a charged-particle beam according to claim 2, wherein the optical beam is an infrared ray applied to the wafer from the back side of the wafer.

* * * * *